United States Patent [19]

Nakabayashi et al.

[11] Patent Number: 4,876,670

[45] Date of Patent: Oct. 24, 1989

[54] VARIABLE DELAY CIRCUIT FOR DELAYING INPUT DATA

[75] Inventors: Takeo Nakabayashi; Masao Nakaya, both of Hyogo, Japan

[73] Assignee: Mitsubishi Denki Kabushiki Kaisha, Tokyo, Japan

[21] Appl. No.: 130,741

[22] Filed: Dec. 9, 1987

[30] Foreign Application Priority Data

Dec. 10, 1986 [JP] Japan .................. 61-293712

[51] Int. Cl.$^4$ .............................................. G11C 7/00
[52] U.S. Cl. ...................................... 365/194; 365/240
[58] Field of Search .................. 365/76, 78, 194, 239, 365/240; 307/78, 76

[56] References Cited

U.S. PATENT DOCUMENTS 3,564,515  2/1971  Gratian .............................. 365/194
4,395,764  7/1983  Matsue ................................. 365/78
4,608,669  8/1986  Klara et al. ..................... 365/194 X

FOREIGN PATENT DOCUMENTS 53-38939  4/1978  Japan .
53-42529  4/1978  Japan .
53-42634  4/1978  Japan .
61-29499  2/1986  Japan ...................... 365/78

Primary Examiner—Joseph A. Popek
Attorney, Agent, or Firm—Lowe, Price, Leblanc, Becker & Shur

[57] ABSTRACT

A bit length corresponding to a delay time of required data is preset in a bit length setting circuit (15). A write timing signal from an external control circuit (6) is applied to a write address decoder (3) and a read timing signal generating circuit (2). Input data is written into memory cells in a memory device (5) addressed by the write address decoder (3) operating in response to the write timing signal. On the other hand, a read timing signal generating circuit (2) generates a read timing signal delayed from the write timing signal by a delay time corresponding to a bit length signal in response to the bit length signal from the bit length setting circuit (15) and the write timing signal from outside. The read address decoder (4) sequentially addresses memory cells containing input data which have been written, reads written data and then outputs output data. Applications of the circuit include frame synchronization, variable delay and storage of picture data in a video communications system.

6 Claims, 8 Drawing Sheets

RECEIVED DATA

| DATA 4 | F4 | DATA 3 | F3 | DATA 2 | F2 | DATA 1 | F1 | DATA 0 |

VARIABLE DELAY CIRCUIT FOR DELAYING INPUT DATA

BACKGROUND OF THE INVENTION

1. Field of the Invention

The present invention relates to a variable shift register and, more particularly, to a variable delay circuit for outputting delayed input data.

2. Description of the Prior Art

FIG. 1A is a block diagram showing a circuit for detecting a frame synchronization used in a communication system, using a conventional variable shift register. Referring to FIG. 1A, reference numerals 11-13 each denote variable shift registers, reference numeral 14 denotes a frame synchronization detecting circuit for receiving input or output signals of the variable shift registers 11-13 and detecting a frame synchronization of a signal, reference characters S1-S4 denote nodes showing inputs and/or outputs of each of the variable shift registers 11-13 and the frame synchronization detecting circuit and reference numeral 15 denotes a bit length setting circuit for receiving an input of a bit length setting signal for the variable shift registers and applying a bit length signal to each of the variable shift registers 11-13 for determining a delay time designated by each of the variable shift registers 11-13. In addition, the term "bit length" means the "length of a delay time" in this specification.

FIG. 1B shows a received data received by the circuit shown in FIG. 1A. Reference characters DATA0-DATA4 denote data containing necessary information out of those received data and reference characters F1-F4 denote frame synchronization patterns required for detecting a frame synchronization.

An operation is now described. The received data shown in FIG. 1B received by the circuit shown in FIG. 1A is inputted from the node S4 to the variable shift register 13 and then outputted from this circuit through the variable shift register 12 and the variable shift register 11. By appropriately setting the bit length of the variable shift registers 11-13 corresponding to a time interval between the frame synchronization patterns F1-F4 contained in the received data, the received data can be delayed by the time interval between the frame synchronization patterns F1-F4 at each of the variable shift registers 11-13. Therefore, at a certain time, the frame synchronization patterns F1, F2, F3 and F4 can be simultaneously detected at the nodes S1, S2, S3 and S4, respectively by the frame synchronization detecting circuit 14 and, as a result, it can be appreciated that the received data has been received in proper synchronization.

FIG. 2 is a system diagram showing the variable shift register used in a conventional frame synchronization detecting circuit, for example, shown in FIG. 1A. Referring to FIG. 2, reference characters R denote one-bit registers, reference numeral 1 denotes a bit length selecting circuit for determining a delay time to be achieved by this variable shift register, reference numeral 15 denotes a bit length setting circuit for applying bit length signals to the bit length setting circuit 1 to determine a delay time to be achieved by this variable shift register, reference characters S1-S8 denote switches controlled by the bit length selecting circuit 1. Reference character DI denotes input data, reference character DO denotes output data, reference characters a1, a2 and a3 denote bit length signals outputted from the bit length setting circuit 15 and applied to the bit length selecting circuit 1, and reference characters b1-b8 denote bit length switching signals outputted from the bit length selecting circuit 1 for activating the switches S1-S8.

Next, the operation of the thus structured shift register is described. When bit length data is set to the bit length setting circuit 15 to obtain a required delay time, the bit length signals a1, a2 and a3 are applied to the bit length selecting circuit 1 and, as a result, the bit length switching signals b1-b8 are outputted. Only one of the bit length switching signals b1-b8 is at "H" level, so that only one corresponding switch out of the switches S1-S8 is opened. Therefore, a word length of the shift register in FIG. 2 is determined.

Since the conventional variable shift register is thus structured, it has a problem that the number of registers used is increased causing larger power consumption when the delay time becomes long and the bit length to be set are caused to be long. Another problem was also involved that since the area on the semiconductor chip occupied by the register is as large as several to more than ten times the area occupied by the memory as far as one-bit information is concerned, obtaining an increased delay time or storage capacity in the conventional variable shift register entailed an increased in the occupied area.

Another well-known prior art of interest to the variable shift register of the present invention is now described and the difference between the prior art and the present invention and problems of the prior art are discussed in the following.

A variable bit length shift register comprising a RAM (Random Access Memory) is disclosed in Japanese Laying-Open Gazette No. 38939/1978 titled "Variable Bit Length Shift Register Device".

A variable shift register comprising a RAM and a variable counter in which a count number can be set is disclosed in Japanese Laying-Open Gazette No. 42529/1978 titled "Variable Shift Register".

A variable shift register comprising a RAM and a ring counter is disclosed in Japanese Laying-Open Gazette No. 42634/1978 titled "Variable Shift Register".

References of the above-mentioned three prior arts are obviously different from the present invention in that, each of the memory cells in the RAM of those three references does not comprise a circuit which is comprised in the present invention described in the following and which can perform a writing operation and a reading operation at the same time from and to different memory cells. Those three prior art references necessitate division of one cycle of a clock signal into a write cycle for controlling signals for writing and a read cycle for controlling signals for reading. Therefore, there were problems in which a control circuit becomes complicated and the length of one cycle of the clock signal becomes more than twice as long as an access time of the normal RAM, that is, an operating speed is limited.

SUMMARY OF THE INVENTION

Therefore, it is a main object of the present invention to provide a variable delay circuit in which the increase in power consumption can be reduced even if the required delay time is rendered to be long when a long delay time is required. It is another object of the present invention is to provide a variable delay circuit in which even if the required delay time or the storage capacity is increased, the increase in the occupied area on the semiconductor chip can be reduced and which can easily cope with the increase in the delay time or the storage capacity.

Briefly, the present invention comprises write address decoder means for selectively accessing memory cells of two-dimensional array comprised in a memory device for storing input data, and for writing the input data; read address decoder means for accessing memory cells in a memory device and reading the written input data; and programmable timing signal generating means, synchronized with the write address decoder circuit and responsive to the signal from programmable delay time setting means for setting a desired delay time, for controlling the read address decoder means following a programmable delay time.

In a preferred embodiment of the present invention, the present invention comprises a write input terminal for receiving a write request signal synchronizing the write address decoder means with the programmable timing signal generating means, the read address decoder means being connected to an output of the programmable timing signal generating means.

According to the present invention, input data is sequentially written into memory cells in a memory device addressed by write address decoder means, timing signal generating means applies a signal delayed by a delay time set by delay time setting means to read address decoder means and the input data written in the memory device is read and outputted sequentially from the memory cells designated by the read address decoder means.

According to the present invention, since the memory device having memory cells of two-dimensional array is used as temporary data memory means for delaying input data, a first advantage is brought about that power consumption does not increase even if a delay time of the input data is rendered to be long. According to the present invention, a second advantage is brought about that since the occupied area on the semiconductor chip in this memory device is small, the demand for the increase in a delay time and memory capacity can be easily coped with in terms of the occupied area.

These objects and other objects, features, aspects and advantages of the present invention will become more apparent from the following detailed description of the present invention when taken in conjunction with the accompanying drawings.

BRIEF DESCRIPTION OF THE INVENTION

Figure 6A:
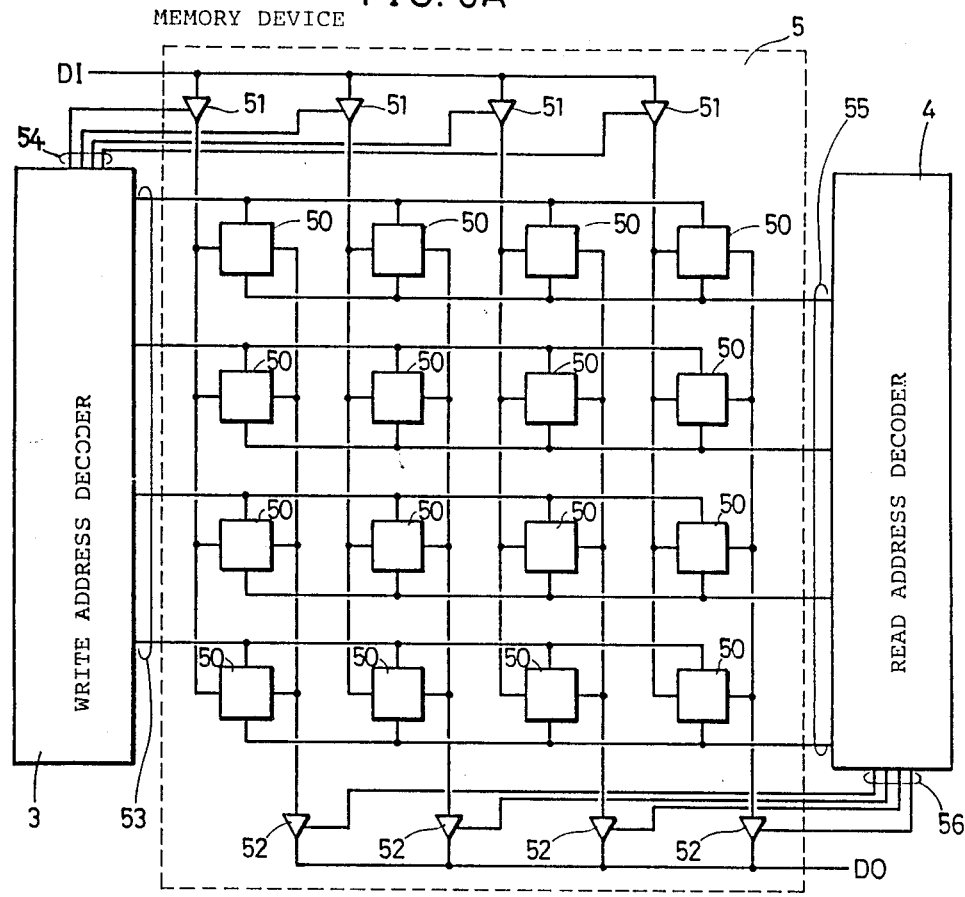
FIG. 6A is a circuit diagram showing one example of a circuit of a memory device comprising memory cells in accordance with the present invention.
Figure 6B:
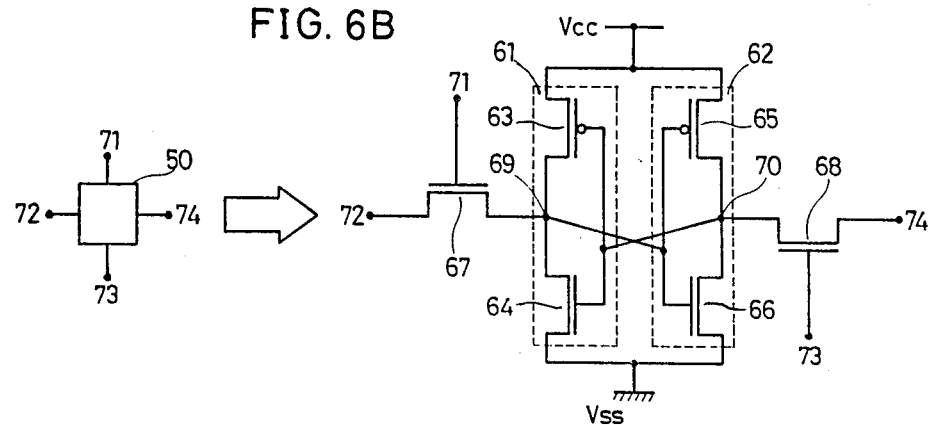

FIG. 6B a circuit diagram showing one example of a memory cell shown in FIG. 6A.

Figure 7A:
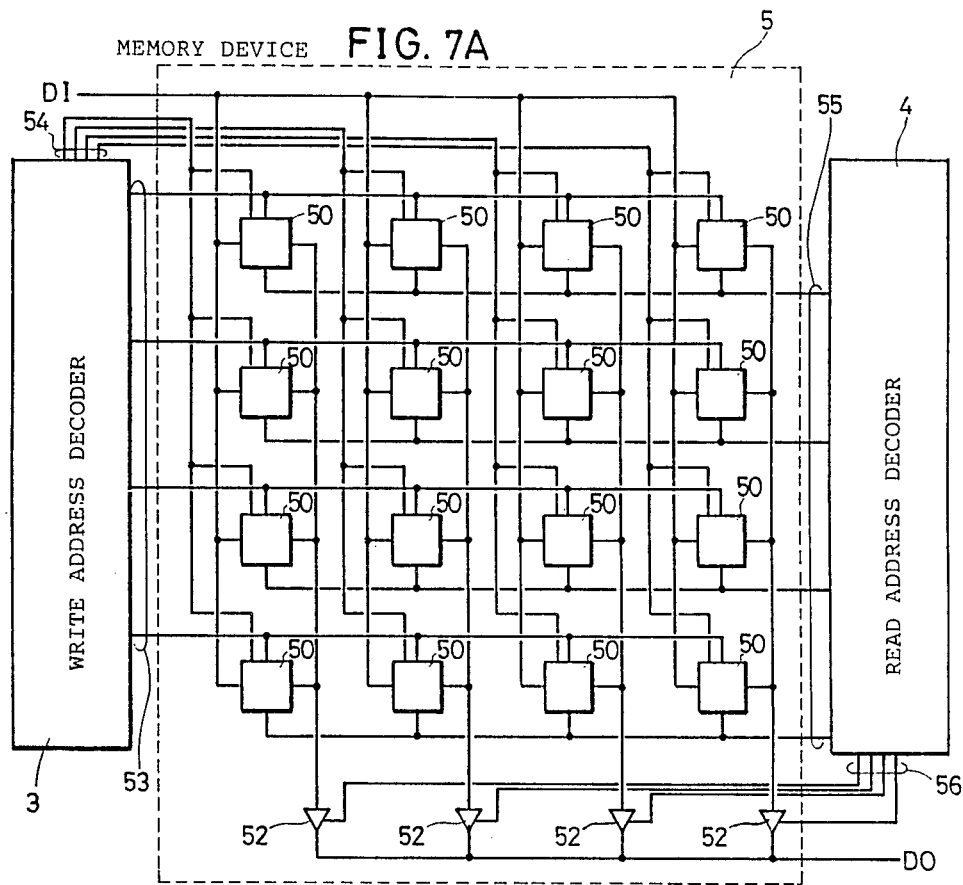

FIG. 7A is a circuit diagram showing another example of a circuit of a memory device comprising memory cells in accordance with the present invention.

Figure 7B:
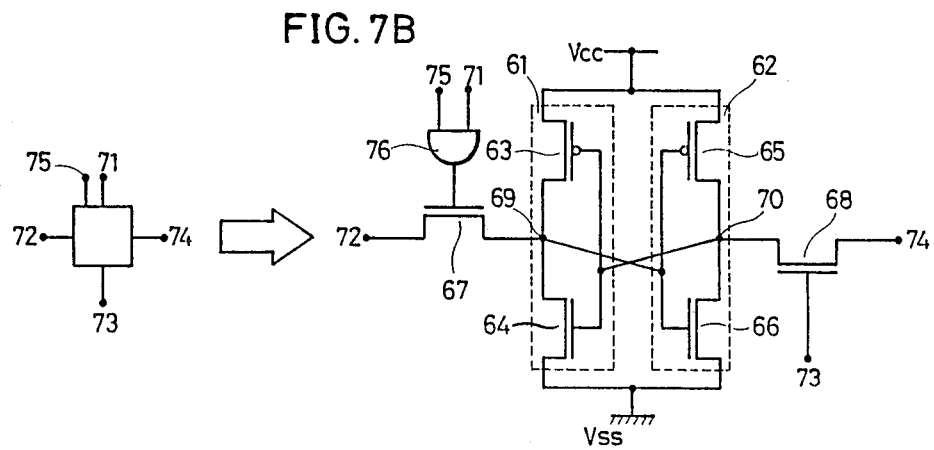

FIG. 7B is a circuit diagram showing one example of a memory cell shown in FIG. 7A.

Figure 8:
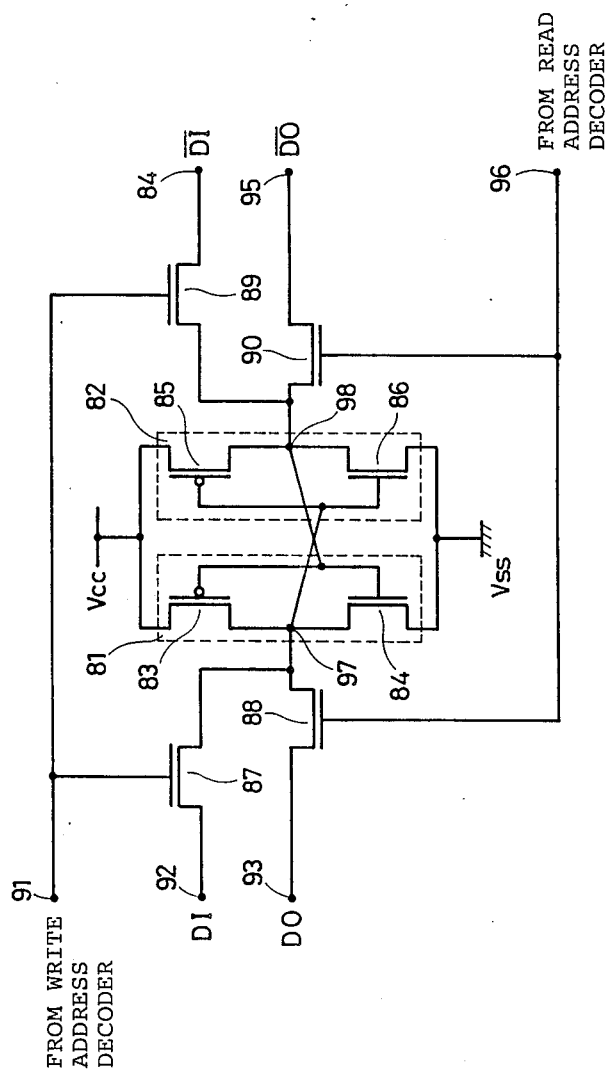

FIG. 8 is a circuit diagram of another example of a memory cell of a memory device in accordance with the present invention.

DESCRIPTION OF THE PREFERRED EMBODIMENTS

Figures 1A, 1B:
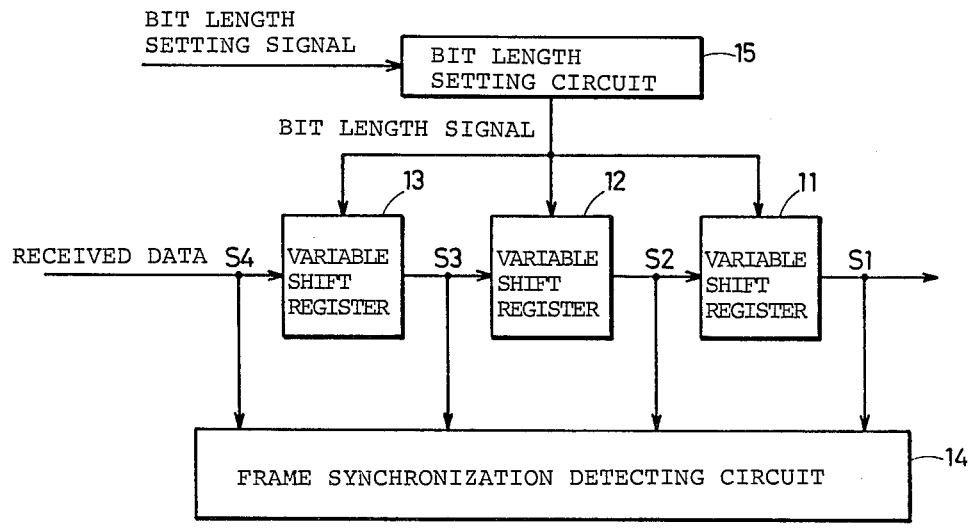
FIG. 1A is a block diagram showing a circuit for detecting a frame synchronization used in a communication system and using the conventional variable shift register.
FIG. 1B is a diagram showing a schematic change of a received signal received by the circuit in FIG. 1A.
Figure 2:
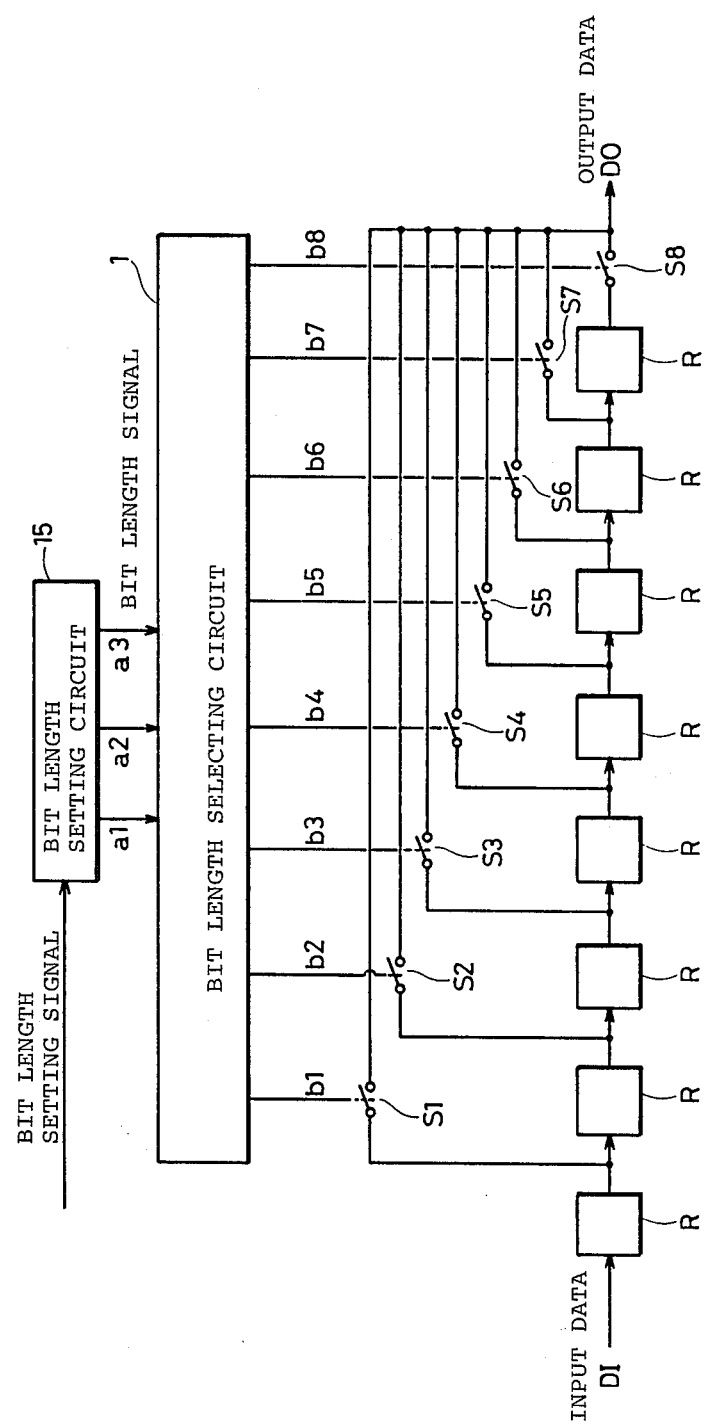
FIG. 2 is a system diagram showing a circuit of a conventional variable shift register.
Figure 3:
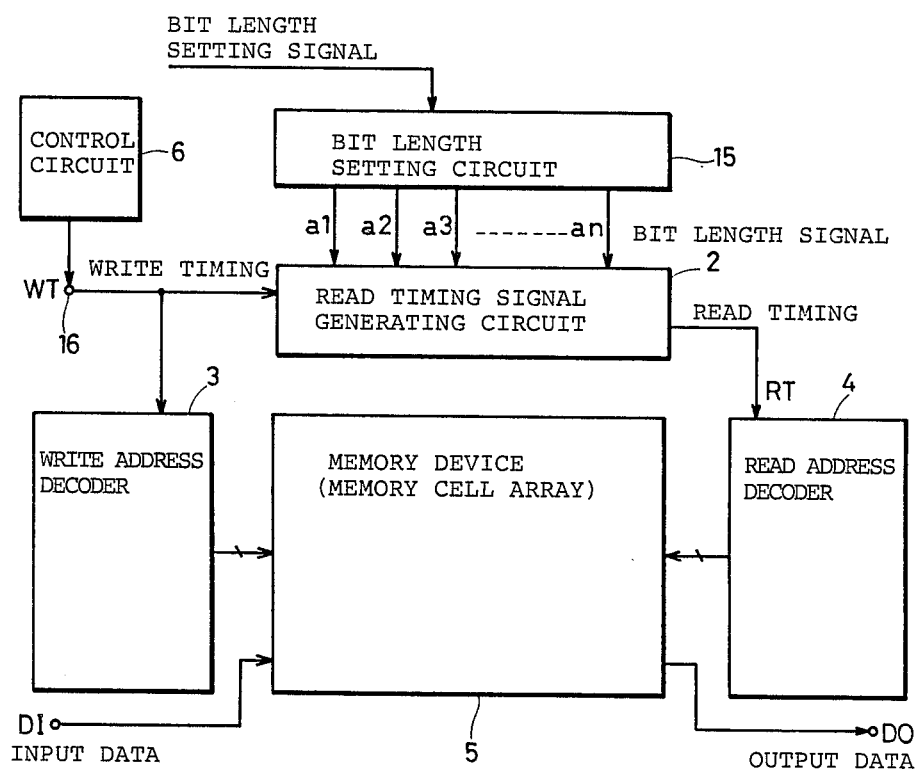
FIG. 3 is a block diagram showing a structure of a variable shift register in accordance with the present invention.

FIG. 3 is a block diagram showing one embodiment of a variable shift register in accordance with the present invention. Referring to FIG. 3, reference numeral 5 denotes a memory device comprising memory cells arranged in a linear or a matrix fashion, reference numeral 3 denotes a write address decoder for writing in the memory device 5, reference numeral 4 denotes a read address decoder for reading from the memory device 5, reference numeral 15 denotes a bit length setting circuit for setting a bit length to obtain a delay time, reference numeral 2 denotes a read timing signal generating circuit for receiving a signal from the bit length setting circuit 15 and generating a delay signal corresponding to a bit length being set, reference character WT denotes a write timing signal generated from a control circuit 6 and applied to the read timing signal generating circuit and the write address decoder 3, reference characters a1–an denote bit length signals outputted from the bit length setting circuit 15 and applied to the read timing signal generating circuit 2, reference character RT denotes a read timing signal applied to the read address decoder 4 after the delay time designated by bit length signals a1–an in response to the timing signal WT and the bit length signals a1–an, reference character DI denotes input data inputted to this shift register, and reference character DO denotes output data outputted from this shift register.

In the variable word length shift register structured as above mentioned, the read timing signal RT is generated later than the write timing signal WT by a prescribed time period in response to bit length signals a1–an in the read timing signal generating circuit 2, whereby the read address decoder 4 begins to operate. Therefore, the input data DI is written sequentially to memory cells in the memory device 5 which are specified by the write address decoder 3 responding to the write timing signal WT, after a prescribed time period, the same is read sequentially from memory cells which are specified by the read address decoder 4 responding to the read timing signal RT generated by the read timing signal generating circuit 2, and the same becomes the output data DO.

Figure 4:
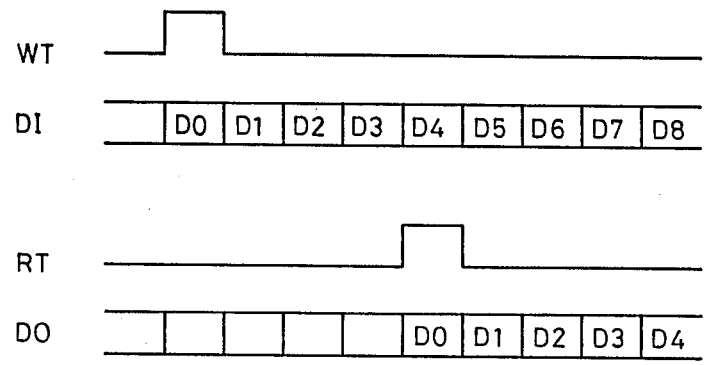
FIG. 4 is a timing chart of a signal for describing an operation of the variable shift register shown in FIG. 3.

FIG. 4 shows a timing chart of each signal when the bit length set in the bit length setting circuit 15 is "4" Referring to FIG. 4, the reference characters WT, DI and DO represent the same signals as those in FIG. 3. Reference characters D0–D5 each denotes one-bit data. As shown in FIG. 4, after the write timing signal WT is generated from the control circuit 6, the input data DI is written in memory cells in the order of the data D0–D5 and, after the timing signal RT is generated, the output data D0 is read from memory cells in the order of the data D0–D5 and then the same is outputted.

Figure 5A:
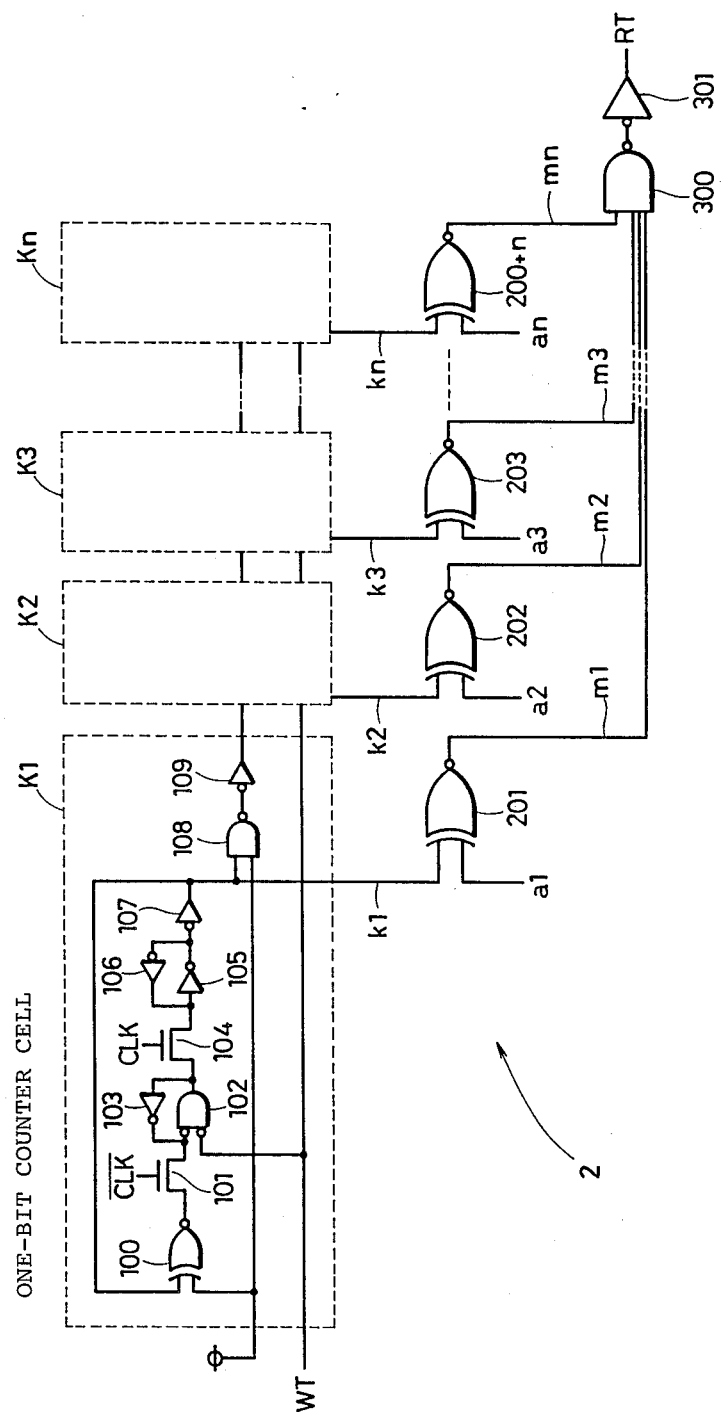
FIG. 5A is a circuit diagram showing one embodiment of a read timing signal generating circuit in accordance with the present invention.
Figure 5B:
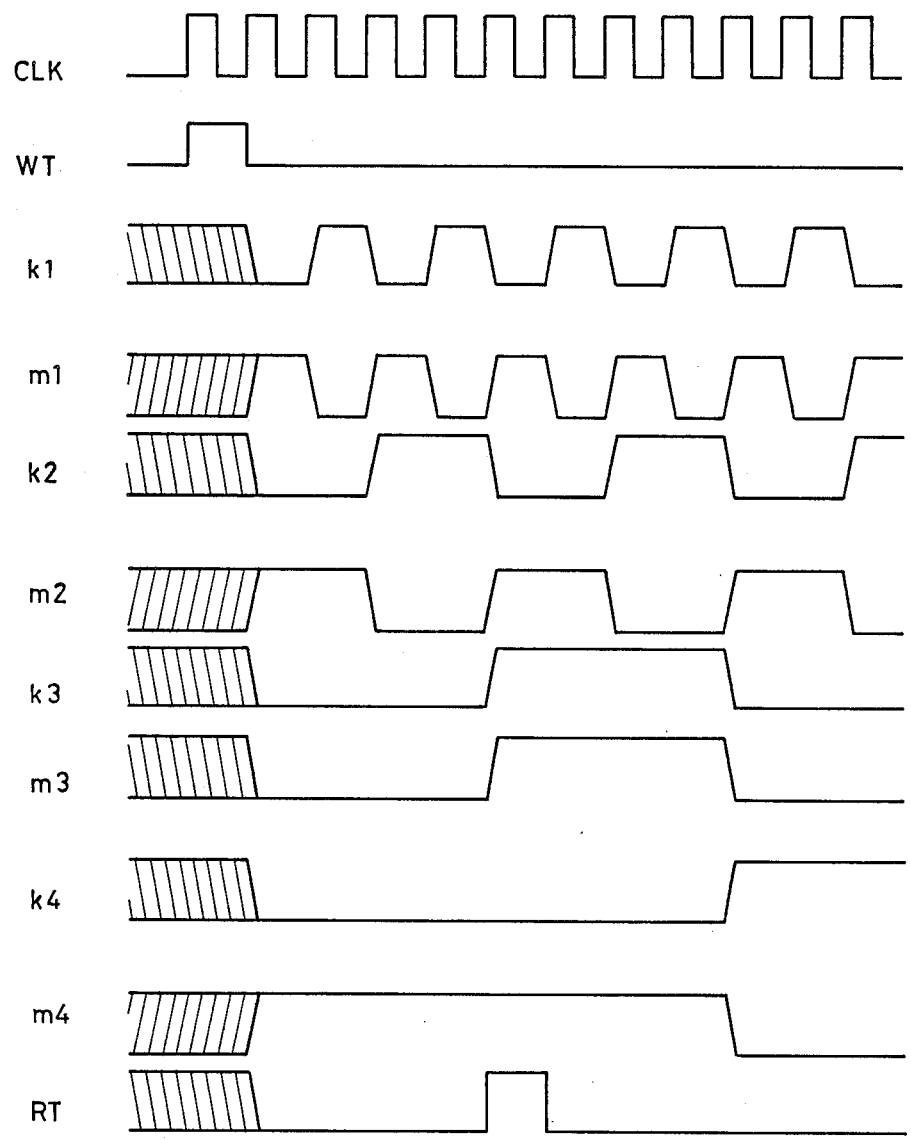
FIG. 5B is a timing chart of a signal for describing an operation of the circuit shown in FIG. 5A.

FIG. 5A is a circuit diagram showing one embodiment of the read timing signal generating circuit 2 in FIG. 3. FIG. 5B is a timing chart for describing an operation of this circuit. Referring to FIG. 5A, reference characters K1–Kn denote one-bit counter cells all having an identical circuit structure and, for simplification, only the internal circuit structure of the cell K1 is shown. Reference numerals 103, 105, 106, 107 and 109 denote $\overline{NOT}$ gates, reference numeral 100 denotes an exclusive $\overline{NOR}$ gate, reference numerals 101 and 104 denote N-channel transmission gates, reference numeral 102 denotes an NAND gate, reference numeral 108 denotes an NAND gate, reference characters CLK and $\overline{CLK}$ denotes a clock signal and an inverted clock signal. In addition, reference numerals 201-200+n denote exclusive $\overline{NOR}$ gates for receiving output signals k1–kn from one-bit counter cells K1–Kn and bit length signals a1–an and generating output signals m1–mn, respectively, reference numeral 300 denotes an NAND gate for receiving output signals m1–mn from the exclusive $\overline{NOR}$ gates 201-200+n, respectively, and performing their NAND operation and reference numeral 301 denotes an NOT gate.

FIG. 5B shows a change of each signal in case of a3=1 and a($\neq$3)=0 out of the bit length signals and reference characters shown in FIG. 5B correspond to signal names shown in the circuit diagram in FIG. 5A.

Next, an operation is described. First, one-bit counter cells K1–Kn are reset by the write timing signal WT and then incremented at every clock signal in response to the clock signal CLK and the inverted clock signal $\overline{CLK}$. the exclusive $\overline{NOR}$ gates 201-200+n each detect coincidence of output signals k1–kn from the corresponding one-bit counter cells K1–Kn with the corresponding bit length signals a1–an and, when they coincide with each other, signals at high level are outputted as output signals m1–mn. The NAND gate 300 receives the output signals m1–mn from the exclusive $\overline{NOR}$ gates 201-200+n and when all output signals m1–mn become high level, it outputs an output signal at low level and then applies the same to the $\overline{NOT}$ gate 301. The $\overline{NOT}$ gate 301 receives this signal from the NAND gate 300 and outputs the reading timing signal RT. In other words, the read timing signal RT is outputted when all output signals m1–mn from the exclusive $\overline{NOR}$ gates 201-200+n become high level, that is, when the counter cells K1–Kn count the clock signal CLK until they coincide with the bit length signals a1–an being set. As a result, the read timing signal RT can be obtained which is delayed from the write timing signal WT by a required time period.

FIG. 6A is a circuit diagram showing one example of connections between the memory device 5 comprising memory cells arranged in a matrix fashion and write address decoder 3 and the read address decoder 4. Although the memory device 5 is shown in FIG. 6A as comprising only sixteen memory cells 50 for simplicity, more memory cells may be comprised in actuality. Referring to FIG. 6A, the memory device 5 is connected to the respective outputs of the write address decoder 3 and the read address decoder 4, and receives the input data DI and outputs the delayed input data DI as the output data DO. The memory device 5 comprises sixteen memory cells 50 and eight tri-state buffers 51 and 52. The write address decoder 3 outputs row output signals 53 and column output signals 54 for selecting a memory cell to be written. The four tri-state buffers 51 connected to the data inputs of the memory device 5 receive the input data DI, respond to the column output signal 54 of the write address decoder 3, select one column comprising the memory cell in which the input data DI should be written and provide the input data DI to only that column. The row output signals 53 are selectively provided to only one row comprising the memory cell in which the output data DI should be written. Meanwhile, the read address decoder 4 outputs row output signals 55 and the column output signals 56 for selecting a memory cell to be read. The row output signals 55 are selectively provided to only one row comprising the memory cell in which data to be read is written. The remaining four tri-state buffers 52 connected to the pre-stage of the outputs of the memory device 5 are connected to the outputs of the memory cells 50, respond to the column output signals 56 of the read address decoder 4 and selectively connect one column comprising the memory cell in which data should be read to the outputs of the memory device 5. The data written in the memory cell selected by the row output signals 55 and the column output signals 56 of the read address decoder 4 is outputted from the outputs as the output signal DO.

FIG. 6B is a circuit diagram showing one example of a circuit of one memory cell out of memory cells 50 shown in FIG. 6A. Referring to FIG. 6B, the memory cell comprises a first inverter 61 and a second inverter 62 having inputs and outputs connected to each other, an n-type MOS transistor 67 connected to the output of the first inverter 61, and a p-type MOS transistor 68 connected to the output of the second inverters 62. The first and second inverters 61 and 62 comprise a p-type MOS transistor 63 and an n-type MOS transistor 64 connected in series at a node 69, and a p-type MOS transistor 65 and an n-type MOS transistor 66 connected in series at a node 70 between the power supply Vcc and the ground Vss. A driving capability of the second inverter 62 is a larger than that of the first inverter 61. In other words, an ON resistance is selected to be low. Nodes 71, 72, 73 and 74 on the left side of FIG. 6B correspond to nodes 71, 72, 73 and 74 on the right side of FIG. 6B, so that the correspondence of the memory cells shown in FIG. 6A to the memory cell shown in FIG. 6B can be clarified. A description is made of an operation which occurs when this memory cell is selected. Referring to FIGS. 6A and 6B, in the writing operation, the transistor 67 receives a voltage signal provided to the node 72 from a tri-state buffer 51 and provides the voltage of the node 72 to the node 69 in response to a voltage signal of the node 71 from the write address decoder 3. When the voltage signal provided to the node 72 is at H level (power supply voltage Vcc level), the voltage of H level is applied to the node 69. The transistor 66 of the second inverter 62 turns on in response to the voltage of H level at the node 69, and brings the node 70 to the voltage of L level (ground Vss level). The transistor 63 of the first inverter 61 turns on in response to the voltage of L level at the node 70 and keeps the node 69 at the voltage of H level. Meanwhile, when the voltage signal applied to the node 72 is at L level, the node 69 obtains the voltage of L level. The transistor 65 of the second inverter 62 turns on in response to the voltage of L level at the node 69 and brings the node 70 to the voltage of H level. The transistor 64 of the first inverter 61 turns on in response to the voltage of H level at the node 70 and keeps the node 69 at the voltage of L level. As mentioned above, in the writing operation, the conductive condition of the first and second inverter 61 and 62 is determined by the level of the voltage signal applied from the tri-state buffers 51 to the node 72.

In the reading operation, the transistor 68 turns on in response to the voltage signal provided from the read address decoder 4 to the node 73 and provides the voltage of the node 70 to the node 74. In this reading operation, the conductive condition of the first and second inverter 61 and 62 would not change.

Since the driving capability of the second inverter 62 is set to be larger than that of the first inverter 61, the above-mentioned writing and reading operation are possible. The driving capability of the first and second inverter 61 and 62 is determined by an experiment at the value in which the above-mentioned operation is possible. It is pointed out that in the memory device having a plurality of memory cells shown in FIG. 6B, the writing and reading operation can be performed simultaneously and separately from and to different memory cells.

FIG. 7A is a circuit diagram showing another example of connections between the memory device 5 and the writing address decoder 3 and the reading address decoder 4 shown in FIG. 3 in accordance with the present invention. FIG. 7B is a circuit diagram showing one example of a circuit of a memory cell out of memory cells 50 shown in FIG. 7A. Comparing the circuit diagram of the memory cell in FIG. 7B with that in FIG. 6B, the only difference is that an AND element 76 with two inputs having the node 71 and 75 is connected to the gate of the transistor 67 in FIG. 7B.

Referring to FIG. 7B, in the writing operation, the AND element 76 receives the voltage signals applied from the writing address decoder 3 to the nodes 71 and 75 and applies the voltage of H level to the gate of the transistor 67 when those voltage signals are at H level. The transistor 67 receives the voltage signals of the input data DI applied to the node 72 and brings the node 69 to the voltage of the node 72. A description after this operation is omitted as it is the same as that in FIG. 6B.

As mentioned above, the selection of a memory cell in the writing operation is performed by the AND element 76 connected to the gate of the transistor 67 as shown in FIG. 7B. Therefore, comparing a circuit diagram in FIG. 7A with that in FIG. 6A, the only difference is that on the inputs side of the memory device 5, the tri-state buffers are omitted and the input data DI is directly connected to the input of each memory cell 50 in FIG. 7A.

FIG. 8 is a circuit diagram showing still another embodiment of a circuit of a memory cell comprised in the memory device 5 shown in FIG. 3 in accordance with the present invention. Referring to FIG. 8, the memory cell comprises an inverter 81 including a p-type MOS transistor 83 and an n-type MOS transistor 84 connected in series, an inverter 82 including a p-type transistor 85 and an n-type MOS transistor 86 connected in series between the power supply Vcc and the ground Vss, n-type MOS transistors 87 and 89 for receiving the input data DI and the inverted signal $\overline{DI}$, respectively, and n-type MOS transistors 88 and 90 for providing the output data DO and the inverted signal $\overline{DO}$ to outside. In setting the driving capability as used in FIGS. 6B and 7B, no particular condition is necessary for the inverters 81 and 82.

An operation is briefly described. Since the operation of the circuit of the memory cell shown in FIG. 8 is the same as that of a well-known static RAM except that the circuit separately has the transistors 87 and 89 for only inputting data and transistors 88 and 90 for only outputting data, an operation of only transistors 87, 89, 88 and 90 is described. Referring to FIG. 8, the transistors 87 and 89 turn on in response to the voltage signal provided from the write address decoder 3 to each gate and apply to nodes 97 and 98 the voltage signal of the input data DI and the inverted signal $\overline{DI}$ applied to the nodes 92 and 94, respectively. Meanwhile, the transistors 88 and 90 turn on in response to the voltage signal applied from the read address decoder 4 to each gate and apply the voltage of nodes 97 and 98 to the nodes 93 and 95, respectively. The voltage of the nodes 93 and 95 are externally outputted as the output DO or $\overline{DO}$. It is also pointed out that in the memory device comprising a plurality of memory cells shown in FIG. 8, the writing and reading operation can be performed simultaneously and separately to and from different memory cells.

As above mentioned, since in the variable shift register in accordance with the present invention, only one portion of the total circuit operates even at operation time, it is possible to reduce power consumption considerably.

In addition, since the employed memory cells occupy a small area on the semiconductor substrate, the whole occupied area of the variable length shift register can be reduced, enabling the increase in the storage capacity.

Furthermore, since the output of the output data $\overline{DO}$ can be delayed by a required delay time by inputting the bit length signals al-an to the read timing signal generating circuit 2, the increase in power consumption due to an increase in the delay time does not occur. In addition, since the read timing signal RT is developed automatically by the read timing signal generating circuit 2, it is not necessary to externally provide the same.

In addition, although input data is one-bit serial data in the above mentioned embodiment, this may be a few-bit parallel.

The variable shift register in accordance with the present invention can be used not only as a delay element for detecting a frame synchronization pattern in a communication system, but also as a delay element or a storage element of data for one or two scanning lines of a picture frame or data for one picture frame in a picture processing system such as a digital television or digital VTR. The present invention may also be embodied in various other memory devices.

As mentioned above, as the present invention comprises a memory device having memory cells, a write address decoder for accessing the memory cells sequentially responsive to a write timing signal, and a read address decoder for accessing the memory cells sequentially responsive to a read timing signal generated automatically based on the write timing signal and the bit length signal, so that only one portion of overall circuit can operate even during operation, a meritorious effect is brought about that it becomes possible to reduce power consumption considerably. In addition, since memory cells which occupy small area on the semiconductor chip are used, it is easy to increase the storage capacity in the occupied area. Another meritorious effect is brought about that by generating a read timing signal automatically, the control of the read address decoder from outside is not necessary.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable delay circuit for delaying input data, comprising:
    a memory device (5) formed by a two-dimensional array of memory cells for storing the input data;
    write address decoder means (3) for accessing selectively memory cells of said memory device (5) and writing said input data into the cells accessed by said write address decoder means (3);
    read address decoder means (4) for accessing said memory cells of said memory device (5) and reading said input data from the cells accessed by said read address decoder means (4);
    programmable timing signal generating means (2) synchronized to an operation of said write addresses decoder means (3) for controlling an operation of said read address decoder means (2) following a programmable delay time; and
    means (15) for setting the programmable delay time of said timing signal generating means (2) to a desired delay time.

2. The circuit of claim 1, which further including a write input terminal (16) for receiving a write request signal, and wherein said operation of said write address decoder means (3) and said programmable timing signal generating means (2) are synchronized to said write request signal, said read address decoder means (4) being connected to an output of said programmable timing signal generating means (2).

3. The circuit of claim 2, wherein said programmable timing signal generating means (2) comprises binary counter means (K1-Kn) comprising a plurality of one-bit counters for counting a clock signal after the counter means is reset in response to write request signal, and circuit means for comparing (a) the output signal from said binary counter means (K1-Kn) with (b) an output signal from said delay time setting means (15) and applying a read request signal to said read address decoder means (4) when (a) and (b) coincide with each other.

4. The circuit of claim 1, wherein said programmable timing signal generating means (2) includes means for generating a variable bit length signal and said setting means includes means responsive to bit length determining signals applied to said input terminal for setting a bit length of said variable bit length signal.

5. A communication system of a type having means for receiving input data in the form of a serial data stream, means for establishing a reference frame synchronization pattern, a variable delay circuit delaying variably said input data and means for comparing an output of said variable delay circuit with said reference frame synchronization pattern, said variable delay circuit comprising:
    a memory device (5) formed by a two-dimensional array of memory cells for storing the input data;
    write address decoder means (3) for accessing selectively memory cells of said memory device (5) and writing said input data into the cells accessed by said write address decoder means (3);
    read address decoder means (4) for receiving said memory cells of said memory device (5) and reading said input data from the cells accessed by said read address decoder means (4);
    programmable timing signal generating means (2) synchronized to an operation of said write addresses decoder means (3) for controlling an operation of said read address decoder means (2) following a programmable delay time; and
    means (15) for setting the programmable delay time of said timing signal generating means (2) to a desired delay time.

6. The communication system of claim 5, wherein said input data comprise input picture data, and wherein said frame synchronization pattern is a picture frame synchronization pattern.

* * * * *